United States Patent
Brown et al.

(10) Patent No.: US 6,580,769 B1
(45) Date of Patent: Jun. 17, 2003

(54) METHOD AND APPARATUS FOR BACKWARD RECURSION NEXT STATE GENERATION IN RECURSIVE CONVOLUTIONAL DECODING

(75) Inventors: Tyler Brown, Mundelein, IL (US); Michael M. Wang, Carpentersville, IL (US)

(73) Assignee: Motorola, Inc., Shaumburg, IL (US)

( * ) Notice: Subject to any disclaimer, the term of this patent is extended or adjusted under 35 U.S.C. 154(b) by 0 days.

(21) Appl. No.: 09/503,791

(22) Filed: Feb. 14, 2000

(51) Int. Cl.[7] ................................................. H04D 1/00
(52) U.S. Cl. ..................................................... 375/341
(58) Field of Search ................................ 375/341, 229, 375/230, 232, 262

(56) References Cited

U.S. PATENT DOCUMENTS

| | | | | |
|---|---|---|---|---|
| 4,972,475 A | * | 11/1990 | Sant'Anselmo | 380/54 |
| 6,028,899 A | * | 2/2000 | Petersen | 375/341 |
| 6,161,209 A | * | 12/2000 | Moher | 714/780 |

* cited by examiner

Primary Examiner—Tesfaldet Bocure
Assistant Examiner—Kevin M Burd
(74) Attorney, Agent, or Firm—Steven A. May; Kenneth A. Haas

(57) ABSTRACT

A decoding method and apparatus performs a forward recursion process on recursive convolutionally generated symbols and performs backward recursion on the symbols wherein a next state for the backward recursion process is based on linearly combining both a plurality of bits defining a current state of a backward recursion process and a hypothesized information bit. In one embodiment, a backward state determinator (200) combines all binary bits in a current state backward recursion register (202) to generate a most significant bit (MSB) (210) of a next state backward recursion register (204). To obtain remaining bits of the next state backward recursion register (204), bits (207a–207n) in the current state backward recursion register (202) are shifted. The shifted bits then serve as the least significant bits (208a–208n) in the next state backward recursion register (204). Accordingly, a suitable linear combination and bit shifting approach is used to determine the content of a next state backward recursion register (204).

7 Claims, 4 Drawing Sheets

US 6,580,769 B1

METHOD AND APPARATUS FOR BACKWARD RECURSION NEXT STATE GENERATION IN RECURSIVE CONVOLUTIONAL DECODING

FIELD OF THE INVENTION

The invention relates generally to convolutional decoders and more particularly to convolutional decoders with forward and backward recursion, such as soft decision output decoders and methods.

BACKGROUND OF THE INVENTION

Soft decision output decoders, such as maximum a posteriori (MAP) decoders are known for use with convolutional codes to decode symbols that represent transmitted information, such as voice, video, data or other information communicated over wireless communication link. Convolutional decoders with forward and backward recursion are known and sometimes used to decode the constituent recursive convolutional codes used in turbo codes. Such decoders perform recursive decoding which uses soft decision information from one pass of a MAP algorithm as input to a next pass of a MAP algorithm to obtain a best estimate of transmitted information data as determined from decoded symbols. As known in the art, in the MAP algorithm, the forward recursion evaluates the joint probability of the state at time t and the received data through time t. The backward recursion computes the probability of the received data from time t to the end of the frame given the state at time. Hence, the computation of this probability for backward recursion decoders typically starts from an end of a frame. The MAP decoder is described, for example, in an article entitled "Optimal Decoding of Linear Codes for Minimizing Symbol Error Rate" by L. R. Bahl et al., published IEEE Transactions on Information Theory, March 1974. One application of this MAP decoder can be found in "Near Shannon Limit Error-Correcting Coding and Decoding: Turbo-Codes",: by C. Berrou et al., Proceedings of ICC '93, Geneva, Switzerland, pp. 1064–1070, May, 1993, incorporated herein by reference.

For decoding of turbo codes, for example, such as in code division multiple access (CDMA) wireless communication systems, decoding of recursive convolutionally coded information bits requires the determination of the following state in a trellis given a present state, and the input bit, such as a hypothetical information bit. Some decoding algorithms, such as the MAP algorithm, update the trellis in a backward as well as in a forward direction so that it is necessary to determine the next state of the coder (encoder) (the state at time n+1 for forward recursion, and the state at time n−1 for backward recursion) given the present state (at n) and the input bit. This operation is typically performed for every state in the trellis and it is therefore important that this process be done in an efficient manner.

Given the current state $\sigma_n$ of the M element shift register, defined as $$\sigma_n = (\sigma_n^0, \sigma_n^1, \ldots, \sigma_n^{M-1})$$

and input bit $u_n$, the next state of the forward recursion can easily be calculated by clocking the shift register to give $$\sigma_{n+1} = (u_n \oplus f_n, \sigma_n^0, \ldots, \sigma_n^{M-2})$$

where the feedback bit $f_n$ is defined as the modulo-2 addition of those shift register elements specified in the feedback polynomial $g_f$. A more difficult problem is finding $\sigma_{n-1}$, the next state of the backward recursion given $\sigma_n$ and $u_n$ where, $$\sigma_{n-1} = (\sigma_{n-1}^0, \sigma_{n-1}^1, \ldots, \sigma_{n-1}^{M-1})$$

One solution is to use a lookup table that provides the next state for each state and input bit. This requires a precomputed $2^{M+1}$ by M bit look up table. However, such look up tables utilize scarce memory and require additional complexity to generate the look up tables.

Accordingly, a need exists for a more efficient recursive convolutional decoder that can avoid the use of such a look up table.

DETAILED DESCRIPTION OF A PREFERRED EMBODIMENT

A method and apparatus for decoding recursive convolutional symbols performs a forward recursion process on recursive convolutionally generated symbols and performs backward recursion on the symbols wherein a next state for the backward recursion process is based on linearly combining both a plurality of bits defining a current state of a backward recursion process and a hypothesized information bit. In one embodiment, a backward recursion process linearly combines all binary bits in a current state backward recursion shift register to generate a most significant bit (MSB) of a next state backward recursion shift register. To obtain remaining bits of the next state backward recursion shift register, bits in the current state backward recursion shift register are shifted. The shifted bits then serve as the least significant bits in the next state backward recursion shift register. Accordingly, a suitable linear combination and bit shifting approach is used to determine the content of a next state backward recursion shift register. The operation may be carried out through a microprocessor, digital signal processor, software, hardware, any suitable combination thereof or any other suitable mechanism.

Figure 1:
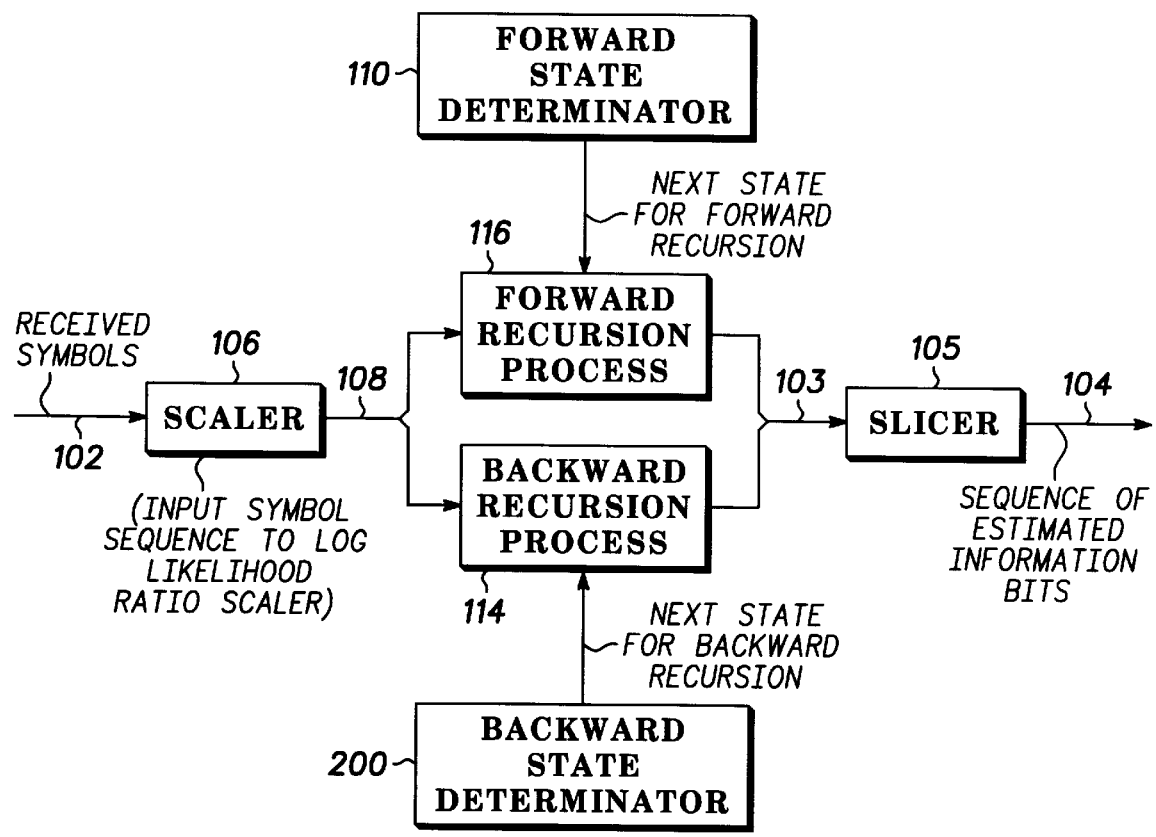
FIG. 1 is block diagram illustrating one example of a decoder in accordance with one embodiment of the invention.

FIG. 1 illustrates a recursive convolutional decoding apparatus, such as MAP decoder 100, that receives recursive convolutionally generated symbols 102 representing encoded information bits and outputs a sequence of estimated binary information bits 104. The MAP decoder 100 may include a suitable scaler 106, as known in the art, that scales the received encoded sequence of symbols to log likelihood ratios, if desired. These are shown as log likelihood ratio of symbols 108. The MAP decoder 100 includes forward and backward recursion decoding processes 114 and 116, that may be carried out, for example, by constituent DSPs or any other suitable mechanism. The MAP decoder 100 includes a backward state determinator 200 for state transition determination for the backward recursion process 114. A binary slicer 105 converts log likelihood ratios of information bits 103 to estimated binary information bits. The sequence of estimated binary information bits 104, from the slicer 105 may be subsequently communicated to a vocoder, or any other suitable device or process.

The MAP decoder 100 performs conventional forward recursion on the recursive convolutionally generated symbols 102. This may be done using a forward state determination process for a suitable forward recursion process 116 as known in the art. The forward state determination process 110 and forward recursion process 116 may be carried out on a suitable DSP or other device. In addition, the MAP decoder 100 performs a recursion processes wherein a next state for a backward recursion decoder is based on linearly combining both a plurality of bits defining a current state in the backward recursion process and a hypothesized information bit $u_n$.

Figure 2:
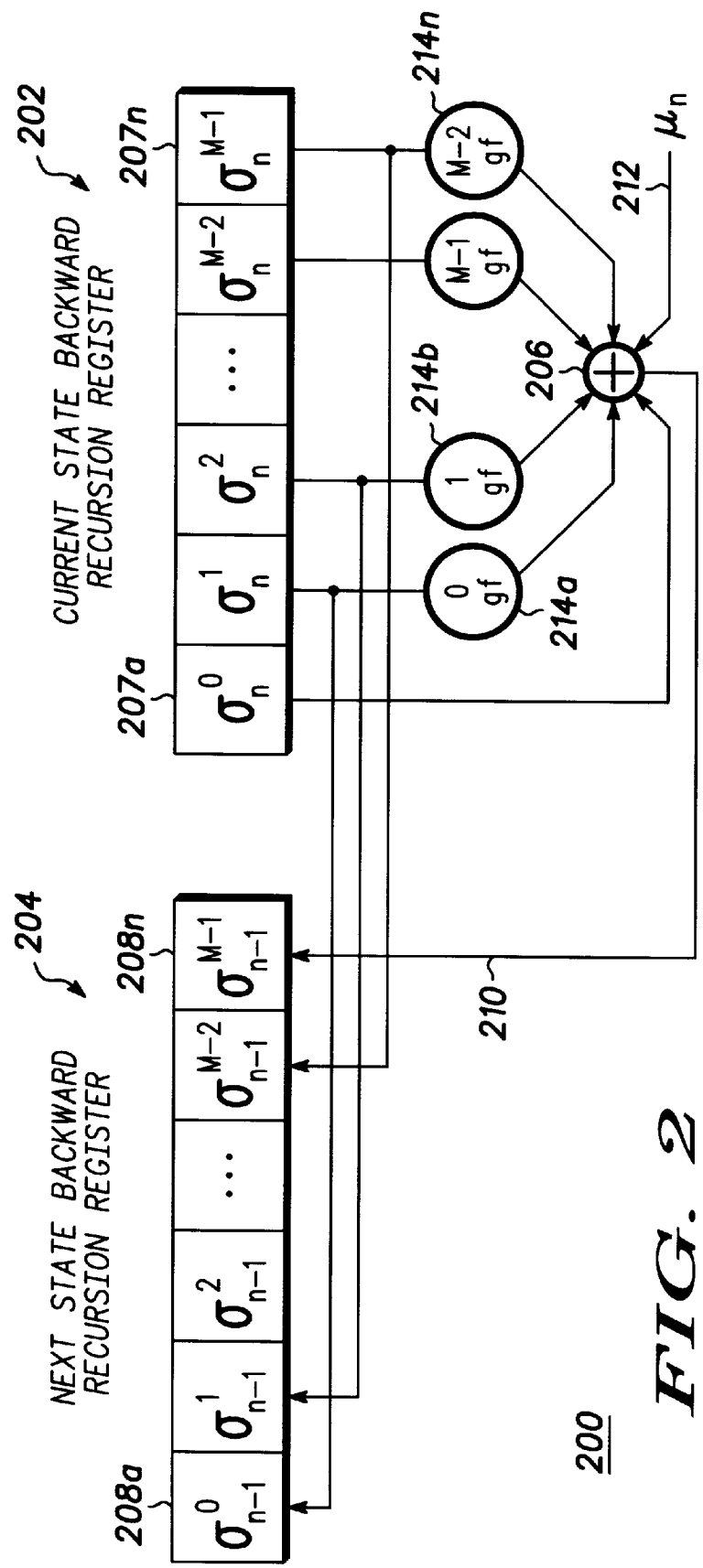
FIG. 2 is a block diagram illustrating a backward state determinator in accordance with one embodiment of the invention.
Figure 3:
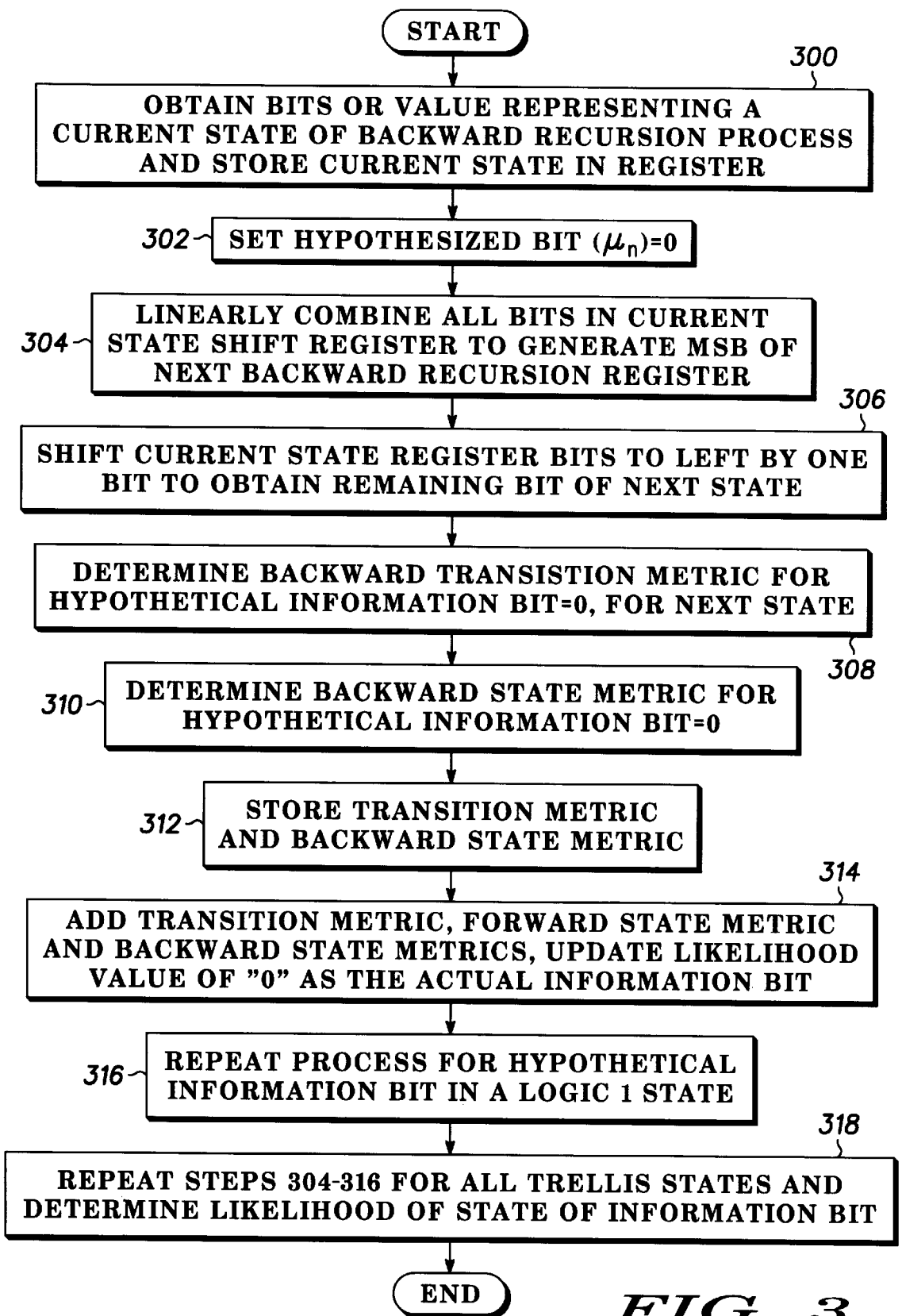
FIG. 3 is a flowchart illustrating one example of the operation of the backward state determinator shown in FIG. 2.

Referring to FIGS. 2 and 3, a method for recursive convolutional decoding will be described. For FIG. 3, it will be assumed that the forward recursion process has been completed as known in the art. As shown in block 300, the process includes obtaining bits or values representing a current state of the backward recursion process and storing a current state in storage elements of the current state backward recursion register 202. As shown in block 302, the process includes setting a hypothesized information bit 212, $u_n$, to a logic zero. As shown in block 304, the method includes linearly combining all bits in the current state backward recursion register 202 to generate the most significant bit 210 of the next state backward recursion register 204. As shown in block 306, the method includes shifting the contents of the current state backward recursion register 202 to the left by one bit to obtain remaining least significant bits 208a–208n of the next state backward recursion register 204.

Once the contents of the next state backward recursion register 204 have been obtained, the transition metric from the current state to the next state is determined (e.g., calculated) as described, for example, in the article entitled, "Optimum Decoding of Linear Codes for Minimizing Symbol Error Rate," authored by L. R. Bahl et al., published in the IEEE Transactions on Information Theory, March, 1974, incorporated herein by reference. For example, the transition metric for the hypothesized information bit is based on the hypothesized information bit being at a first logic level for a next backward recursion state.

As shown in block 310, the method also includes determining a backward state metric for the hypothesized information bit based on the hypothesized information bit 212 being at the first logic level, such as logic"0", as described, for example, in the article entitled, "Optimum Decoding of Linear Codes for Minimizing Symbol Error Rate," authored by L. R. Bahl et al., published in the IEEE Transactions on Information Theory, March, 1974.

As shown in block 312, the method includes storing the backward state metric in memory. As shown in block 314, the decoding process includes adding the transition metric, forward state metric and a backward state metric, as known in the art, to suitably update the likelihood value that a "0" is the actual value of the hypothesized information bit 212 $u_n$. Hence the transition metric, forward state metric and that backward state metric are suitably combined as known in the art. As shown in block 316, the process is repeated with the hypothesized information bit 212 $u_n$ set in a second state, such as in a logic "1" state. As shown in block 318, the steps in blocks 304 through 316 are repeated for all trellis states to determine the likelihood of the state of the information bit. Accordingly, the process includes updating the likelihood value that the first logic level (e.g., logic "0") is the actual logic level associated with the information bit that was originally encoded.

FIG. 2 illustrates one example of a backward state determinator 200 that may be part of the MAP decoder 100. The backward state determinator 200 is used in the backward recursion process 114 carried out on a suitably programmed DSP, microprocessor, discrete logic or any other suitable device or software. In this example, the backward state determinator 200 includes the current state backward recursion register 202, the next state backward recursion register 204, and an adder 206. The adder 206 is a modulo-2 adder. It will be recognized that these elements are functional and may be implemented in any suitable manner. For example, the current state backward recursion register 202 and the next state backward recursion register 204 may be the same register that has its contents suitably overwritten. A next state for the backward recursion decoder is determined based on a linear combination of the contents of the current state backward recursion register 202. The next state backward recursion register 204 is operatively coupled to receive a plurality of most significant bits 207a–207n from the current state backward recursion register 202, as least significant bits (LSB's) 208a–208n. Hence, the least significant bits of the next state backward recursion register 204 are obtained from the most significant bits of the current state backward recursion register 202. To obtain the most significant bit of the next state for the next state backward recursion register 204 indicated as most significant bit 210 register element, adder 206 linearly combines register elements of the current state backward recursion register 202 with a hypothesized information bit 212 $u_n$ to derive the most significant bit (MSB) 210 of the next state backward recursion s register 204. Also as shown, the generator polynomial function coefficients 214a–214n, which are used as known in the art, to indicate connectivity.

Although the backward state determinator 200 is shown as being implemented using hardware, software, shift registers and adders, it will be recognized that any suitable hardware, software or combination thereof may be used.

As shown, the adder 206 receives the polynomial function coefficients 214a–214n associated with each of the most significant bits 207a–207n from the current state backward recursion shift register 202. Accordingly, the backward state determinator 200 generates the most significant bit 210 according to the following formula:

$$\sigma_{n-1}^{M-1} = u_n \oplus \sigma_n^0 \oplus (g_f^0 \cdot \sigma_n^1) \oplus (g_f^1 \cdot \sigma_n^2) \ldots (g_f^{M-2} \cdot \sigma_n^{M-1})$$

Figure 4:
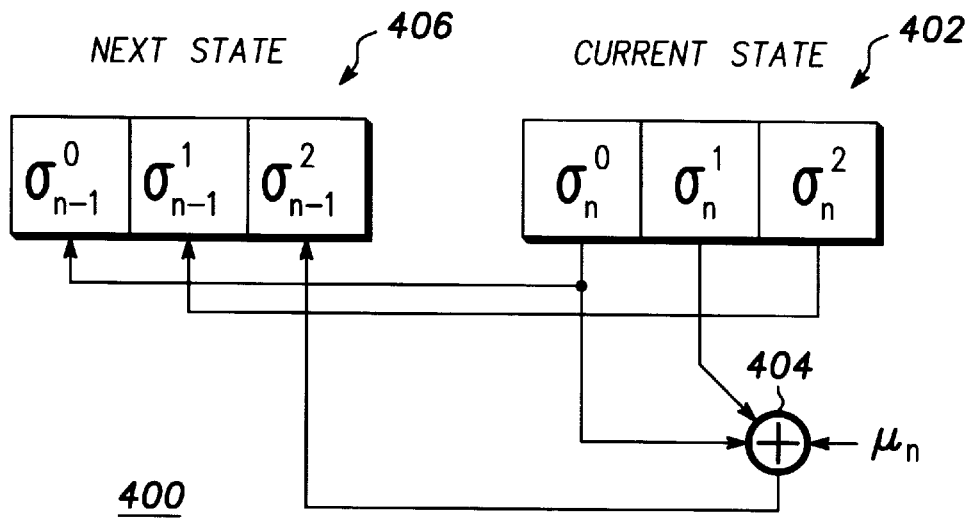
FIG. 4 is a block diagram illustrating one example of a backward state determinator in accordance with one embodiment of the invention.
Figure 5:
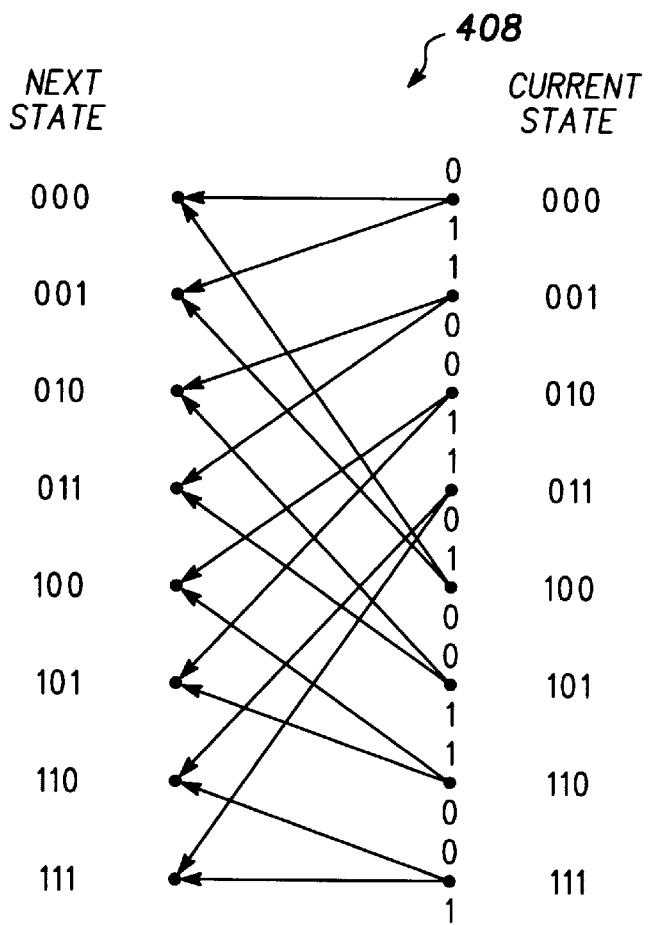
FIG. 5 is a trellis diagram illustrating potential states of the backward state determinator supplied to a decoder in accordance with one embodiment of the invention.

Referring to FIGS. 4 and 5, an example of a three element decoder will be used to illustrate the operation of the invention. In this example, information bits are encoded using a conventional recursive coder, such as of the type described, for example, in TIA/EIA IS-2000A having length M=3, where M is the number of storage elements in the register. In addition, the feedback polynomial has coefficients $(g_f^0, g_f^1, g_f^2) = (0,1,1)$. The backward state determinator 400 derives a next state for the backward recursion process from the present state of the backward recursion process using the current state backward recursion register 402 and modulo-2 adder 404 to populate the next state register 406. For example, the next state $(\sigma_{n-1}^0, \sigma_{n-1}^1, \sigma_{n-1}^2)$ for present state $(\sigma_n^0, \sigma_n^1, \sigma_n^2) = (1,0,1)$ is $(0,1,0)$ for input $u_n=0$ and (0,1,1) for input $u_n=1$. The complete set of state transitions 408 for this example are shown in FIG. 5. Accordingly, a suitable combination of elements of the current state of a backward recursion can be used to directly provide the contents for a next state of a backward recursion without requiring look up table memory.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A method for backward recursion next state generation comprising the steps of:

determining a current state of a backward recursion process, wherein the current state is defined by a plurality of bits;

receiving an information bit; and linearly combining both the plurality of bits and the information bit to determine a next state for a next state backward recursion process, wherein linearly combining comprises linearly combining all bits in a current state backward recursion register by modulo 2 to generate a most significant bit (MSB) of a next state backward recursion register.

2. The method of claim 1 wherein the step of linearly combining further comprises shifting bits in the current state backward recursion register to obtain remaining bits of the next state backward recursion register.

3. The method of claim 2 further comprising steps of:

determining a transition metric for the information bit based the information bit being at a first logic level for a next backward recursion state;

determining a backward state metric for the information bit based the information bit being at the first logic level for a next state in a next backward recursion state;

storing the transition metric and the backward state metric;

repeating the steps of determining a transition metric and determining a backward state metric based on the information bit being at a second logic level;

combining the transition metric, a forward state metric, and the backward state metric; and updating a likelihood value that the first logic level is an actual logic level of an encoded information bit.

4. A backward recursion next state generating apparatus comprising:

a current state backward recursion register;

a next state backward recursion register operatively coupled to receive a plurality of most significant bits from the current state backward recursion register as least significant bits of the next state backward recursion register; and an adder having an input operatively coupled to stages of the current state backward recursion register and operatively coupled to receive an information bit, and an output operatively coupled to output a most significant bit of the next state backward recursion register based on a linear combination of the information bit with the current state.

5. The apparatus of claim 4 wherein the adder is a modulo 2 adder.

6. The apparatus of claim 4 wherein the adder receives polynomial function coefficients associated with each of the plurality of most significant bits from the current state backward recursion register.

7. The apparatus of claim 4 wherein the current state backward recursion register and the next state backward recursion register are the same register that has its contents overwritten.

* * * * *

UNITED STATES PATENT AND TRADEMARK OFFICE
CERTIFICATE OF CORRECTION

PATENT NO.    : 6,580,769 B1
DATED         : June 17, 2003
INVENTOR(S)   : Brown et al.

It is certified that error appears in the above-identified patent and that said Letters Patent is hereby corrected as shown below:

Column 5,
Line 29, delete the phrase "The method of claim 1 where the step of linearly combining further comprises" and insert -- A method for backward recursion next state generation comprising the steps of:
determining a current state of a backward recursion process wherein the current state is defined by a plurality of bits; receiving an information bit; and linearly combining both the plurality of bits and the information bit to determine a next state for a next state backward recursion process and --.

Signed and Sealed this

Sixteenth Day of December, 2003

JAMES E. ROGAN
*Director of the United States Patent and Trademark Office*